United States Patent
Bajaj

(10) Patent No.: US 11,470,956 B2
(45) Date of Patent: Oct. 18, 2022

(54) BRUSH, METHOD OF FORMING A BRUSH, AND STRUCTURE EMBODIED IN A MACHINE READABLE MEDIUM USED IN A DESIGN PROCESS

(71) Applicant: Applied Materials, Inc., Santa Clara, CA (US)

(72) Inventor: Rajeev Bajaj, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 43 days.

(21) Appl. No.: 16/811,935

(22) Filed: Mar. 6, 2020

(65) Prior Publication Data

US 2021/0274926 A1 Sep. 9, 2021

(51) Int. Cl.

| | | |
|---|---|---|
| A46D 3/00 | (2006.01) | |
| A46B 1/00 | (2006.01) | |
| A46B 11/00 | (2006.01) | |
| A46B 13/00 | (2006.01) | |
| B33Y 80/00 | (2015.01) | |
| B29C 64/112 | (2017.01) | |
| B29C 64/124 | (2017.01) | |
| B24B 37/34 | (2012.01) | |
| B33Y 10/00 | (2015.01) | |
| B29L 31/42 | (2006.01) | |
| H01L 21/67 | (2006.01) | |

(52) U.S. Cl.
CPC ............... *A46D 3/00* (2013.01); *A46B 1/00* (2013.01); *A46B 11/0006* (2013.01); *A46B 13/001* (2013.01); *B24B 37/34* (2013.01); *B29C 64/112* (2017.08); *B29C 64/124* (2017.08); *B33Y 10/00* (2014.12); *B33Y 80/00* (2014.12); *A46B 2200/3086* (2013.01); *B29L 2031/42* (2013.01); *H01L 21/67046* (2013.01)

(58) Field of Classification Search
CPC .......... A46D 3/00; B33Y 10/00; B33Y 80/00; B29C 64/124; B29C 64/112; A46B 1/00; A46B 11/0006; A46B 13/001; B24B 37/34
USPC ........................................... 15/246
See application file for complete search history.

(56) References Cited

U.S. PATENT DOCUMENTS

| 8,444,890 B2 | 5/2013 | Drury |
| 9,216,546 B2 | 12/2015 | DeSimone et al. |
| 10,384,330 B2 | 8/2019 | Bajaj et al. |

(Continued)

FOREIGN PATENT DOCUMENTS

WO 2017127221 A1 7/2017

OTHER PUBLICATIONS

International Search Report/ Written Opinion issued to PCT/US021/018022 dated Jun. 7, 2021.

(Continued)

*Primary Examiner* — Katina N. Henson
(74) *Attorney, Agent, or Firm* — Patterson + Sheridan, LLP

(57) ABSTRACT

Embodiments described herein generally relate to a brush, a method of forming a brush, and a structure embodied in a machine readable medium used in a design process are provided. The brush includes a body and a channel configured to deliver a cleaning liquid through holes in the body. The method forms the brush using 3D printing. The structure provides details for making the brush. The disclosure herein allows a method of forming a brush that does not require the removal of active porogen.

12 Claims, 10 Drawing Sheets

(56) References Cited

U.S. PATENT DOCUMENTS

| | | |
|---|---|---|
| 2011/0204538 A1 | 8/2011 | Drury |
| 2011/0277789 A1* | 11/2011 | Benson ................ A46B 13/008 |
| | | 134/6 |
| 2013/0048018 A1 | 2/2013 | Wargo et al. |
| 2013/0139851 A1 | 6/2013 | Sin et al. |
| 2014/0230170 A1 | 8/2014 | Patel |
| 2019/0202024 A1 | 7/2019 | Ganapathiappan et al. |

OTHER PUBLICATIONS

A Breakthrough Method for the Effective Conditioning of PVA Brush Used for Post-CMP Process, LEE et al., ECS Journal of Solid State Science and Technology 8, p. 307-p. 312 (2019), Published Jun. 5, 2019, 6 pages.

Influence of post-CMP cleaning on Cu interconnects and TDDB reliability, Noguchi et al., IEEE Transactions on Electron Devices 52, 934-941 (2005), Published Apr. 25, 2005, 8 pages.

* cited by examiner

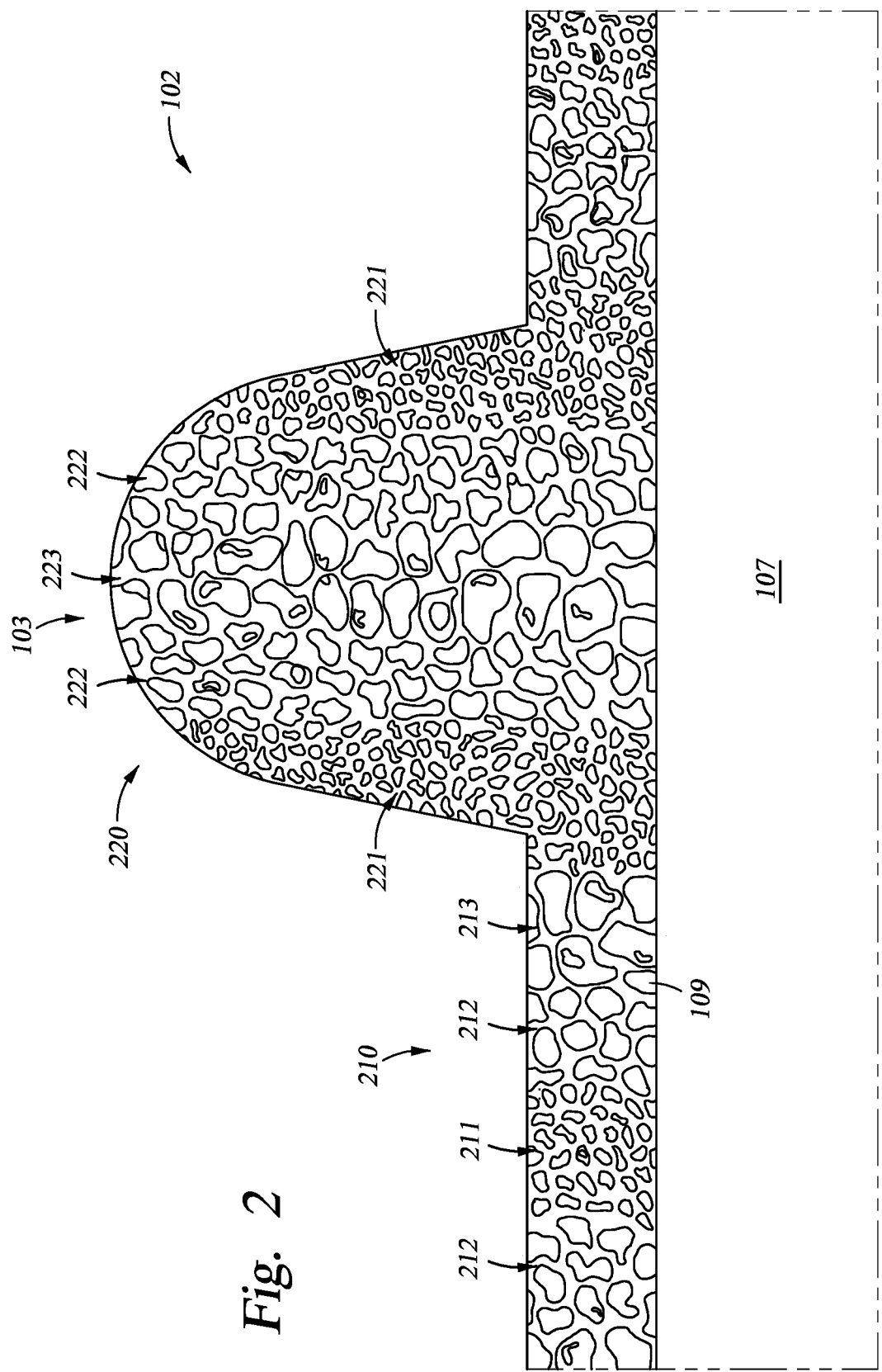

BRUSH, METHOD OF FORMING A BRUSH, AND STRUCTURE EMBODIED IN A MACHINE READABLE MEDIUM USED IN A DESIGN PROCESS

BACKGROUND

Field

Embodiments of the present disclosure generally relate to an article of manufacture and a method and, more specifically, to a brush, a method of forming a brush, and a structure embodied in a machine readable medium used in a design process.

Description of the Related Art

Chemical mechanical polishing (CMP) is commonly used in the manufacturing of high-density integrated circuits to planarize or polish a layer of material deposited on a substrate. A typical CMP process includes contacting the material layer to be planarized with a polishing pad and moving the polishing pad, the substrate, or both, and hence creating relative movement between the material layer surface and the polishing pad, in the presence of a polishing fluid comprising abrasive particles.

Various residue and particles can be left behind after the CMP process which often are removed by a post-CMP clean. Post-CMP cleaning equipment can include brushes that are configured to dispense cleaning liquid onto a surface of the substrate. The brushes are urged, or pressed, against the substrate surface to remove residue and particles. Cleaning liquids dispersed from holes, or pores, in the brush increase the cleaning capabilities of the post-CMP cleaning brush.

Often, brushes used in the above-described post-CMP cleaning processes are selected based on the material properties of the brush material and the suitability of those material properties for the desired post-CMP cleaning application. Brushes are typically made of microporous polyvinyl alcohol/acetate (PVA). One example of a material property that can be adjusted to tune the performance of a brush is the porosity of a polymer material used to form the brush. Properties related to the polymer material include pore size, pore structure, and material surface asperities.

One drawback in the art is that conventional methods of introducing porosity into the brush material typically comprise blending a pre-polymer composition with a porogen, or porosity-forming agent (such as a water soluble material). However, the porosity-forming agent must be removed after curing of the brush. The casting and subsequent porogen removal is a cumbersome and lengthy process. In addition, it is difficult to develop and create new designs without major changes to the manufacturing process. Also, post-processing of the brush can be needed in order to standardize feature sizes (i.e., height of brushing nodules or nodes).

Therefore, there is a need in the art for manufacturing brushes with better control of material properties.

SUMMARY

Embodiments described herein generally relate to a brush, a method of making a brush, and a structure used in in a design process to form a brush. The brushes disclosed herein have greater control of material properties, such as porosity, hole size, and hole variation. These material properties allow for more effective post-CMP cleaning.

In one embodiment, a brush is provided. The brush includes a body and a channel disposed in the body. The body includes a first polymer material that includes a plurality of body holes. The plurality of body holes has a first body region. A first body porosity of the first body region is greater than about 70%. The channel is fluidly coupled to the plurality of body holes.

In another embodiment, a structure embodied in a machine readable medium used in a design process is provided. The structure includes a brush. The brush includes a body and a channel disposed in the body. The body includes a first polymer material that includes a plurality of body holes. The plurality of body holes has a first body region. A first body porosity of the first body region is greater than about 70%. The channel is fluidly coupled to the body plurality of holes.

In yet another embodiment, a method of forming a brush is provided. The method includes forming a body of the brush using a three-dimensional (3D) printing process, and forming a channel in the body of the brush using a 3D printing process. The body includes a first polymer material comprising a plurality of body holes. The plurality of body holes has a first body region. A first body porosity of the first body region is greater than about 70%. The channel is fluidly coupled to the body plurality of holes.

In still another embodiment, a non-transient computer readable medium (CRM) is provided. The CRM contains program instructions for causing a system to perform a method of forming a brush. The method includes forming a body of the brush using a three-dimensional (3D) printing process, and forming a channel in the body of the brush using a 3D printing process. The body includes a first polymer material comprising a plurality of body holes. The plurality of body holes has a first body region. A first body porosity of the first body region is greater than about 70%. The channel is fluidly coupled to the body plurality of holes.

In another embodiment, an additive manufacturing system is provided. The additive manufacturing system includes a motion system, a tank system, a treatment source, and a controller. The motion system includes a support member and a support actuator. The motion system is disposed above the tank system. The tank system is disposed above the treatment source. The tank system includes a tank configured to contain a printing liquid. The treatment source is configured to emit a treatment emission onto a surface of the printing liquid. The controller is configured to control the support actuator. The support actuator is configured to raise the support member with respect to the tank system.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2 illustrates a zoomed-in portion of a brush, according to one embodiment.

Figure 1A:
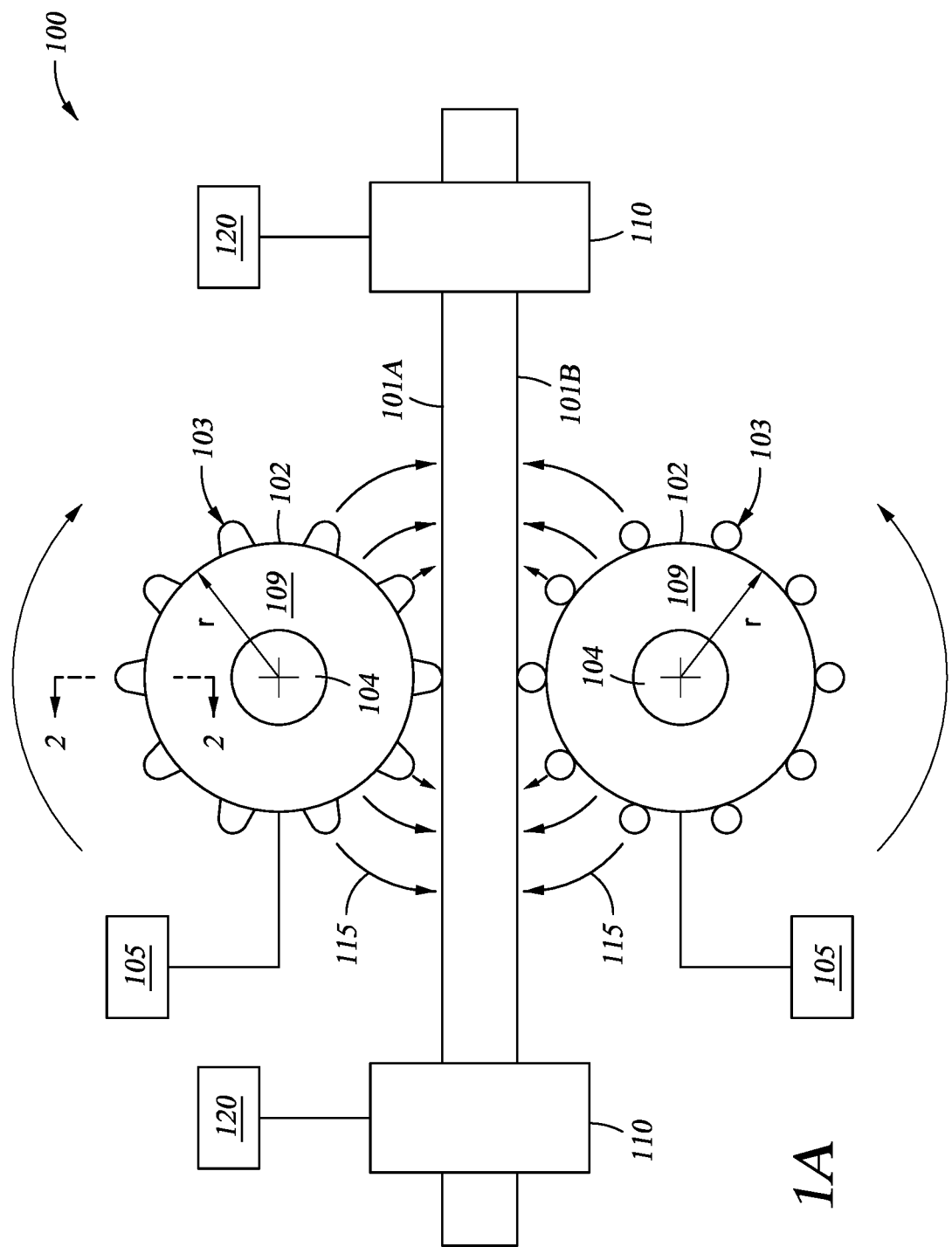
FIG. 1A illustrates a schematic side view of a cleaning system, according to one embodiment.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments described herein generally relate to a brush, a method of forming a brush, and a structure embodied in a machine readable medium. The brush includes a body and a channel configured to deliver a cleaning liquid through holes in the body. The method forms the brush using 3D printing. The structure provides details for making the brush. The brushes are rotated in order to clean the surface of a substrate. The method does not require the removal of active porogen used in conventional brush-making methods. This improves the speed and ease of manufacture of the brush. In addition, new designs can be used with the same manufacturing process by varying the details of the structure and 3D printing method. Embodiments of the disclosure can be useful for, but are not limited to, brushes and manufacture of brushes for post-CMP cleaning processes.

As used herein, the term "about" refers to a +/−10% variation from the nominal value. It is to be understood that such a variation can be included in any value provided herein.

The brushes feature pores that are selectively arranged across a brushing surface (i.e., a surface of the body of the brush and/or the brushing elements if present). As used herein, the term "pore" includes openings defined in the brushing surface, voids formed in the material below the brushing surface, pore-forming features disposed in the brushing surface, and pore-forming features disposed in the brushing material below the brushing surface. Pore-forming features typically comprise a water-soluble-sacrificial material that dissolves upon exposure to a fluid, thus forming a corresponding opening in the brushing surface and/or void in the brushing material below the brushing surface. In some embodiments, the water-soluble-sacrificial material swells upon exposure to a fluid, thus deforming the surrounding brushing material to provide asperities at the brushing surface. The resulting pores and asperities desirably facilitate transporting liquid to the interface between the brushing surface and a to-be-brushed material surface of a substrate.

The term "selectively arranged pores" as used herein refers to the distribution of pores within the brushing surface. Herein, the pores are distributed in one or both directions of an X-Y plane parallel to the brushing surface (i.e., laterally) and in a Z-direction which is orthogonal to the X-Y planes (i.e., vertically).

Figure 1B:
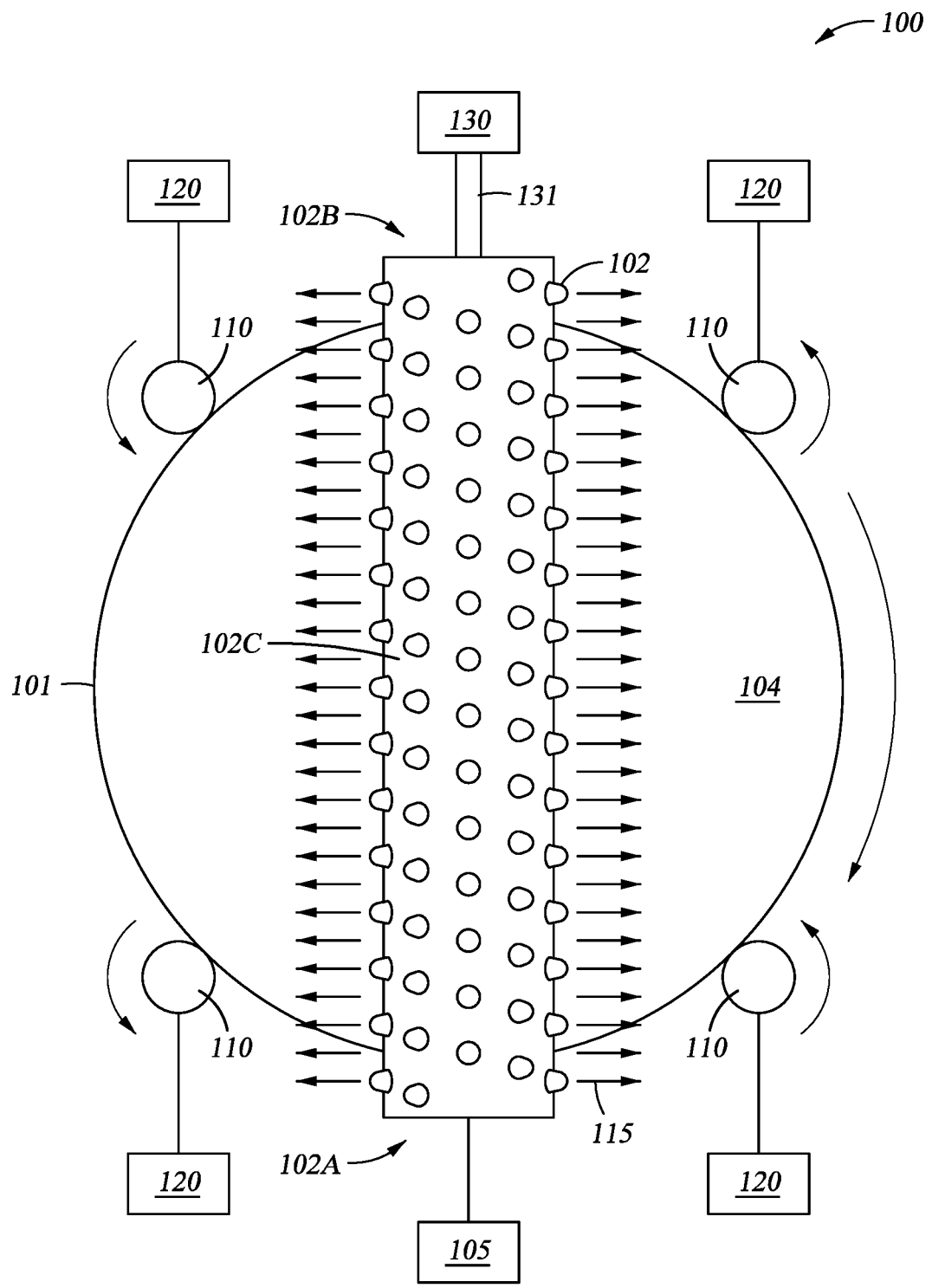
FIG. 1B illustrates a schematic top view of a cleaning system, according to one embodiment.

FIG. 1A illustrates a schematic side view of a cleaning system 100, according to one embodiment. FIG. 1B illustrates a schematic top view of the cleaning system 100, according to one embodiment. The cleaning system 100 is configured to clean a substrate 101 (e.g., after a chemical mechanical polishing (CMP) process). As shown, the cleaning system 100 includes a plurality of rollers 110, one or more brushes 102, one or more fluid sources 130, one or more fluid inputs 131, and one or more brush actuators 105.

The one or more brushes 102 are configured to clean and/or remove debris, residue, or other contaminants from a surface of the substrate 101. For example, the debris can include leftover polishing pad debris, slurry particles and other polish byproducts. As shown, the brush 102 includes a body 109, a channel 104 disposed in the body, and a plurality of brushing elements 103. FIGS. 1A and 1B illustrate a cleaning system 100 including two brushes 102, with one of the brushes cleaning a top surface 101A of the substrate 101, and another brush cleaning a bottom surface 101B of the substrate. However, any number of brushes 102 can be included, with any number of brushes on either surface of the substrate 101. In addition, although a circular substrate 101 is illustrated in FIGS. 1A and 1B, any shape of substrate can benefit from the cleaning system 100 disclosed herein. The length and radius of the brushes 102 vary with the size of the substrate to be cleaned. The brushes 102 have a brushing surface, defined as a portion of the brush that touches the surface of the substrate 101. The brushing surface can include any portion of the body 109 that touches the surface of the substrate 101. The brushing surface can include any portion of the brushing elements 103 (if present) that touches the surface of the substrate 101.

Although the brush 102 is shown in FIGS. 1A and 1B as having a generally cylindrical shape, other brush shapes are contemplated. For example, the brush 102 can have a wedge shape, such that a radius r of the brush is larger at a first end of the brush 102A than at a second end 102B of the brush. In another example, the brush 102 has an hourglass shape, such that the radius r of is smaller at the center 102C of the brush than at either the first end 102A or the second end 102B of the brush.

The one or more brush actuators 105 are configured to rotate the one or more brushes 102. The one or more brushes 102 can be connected to a single brush actuator 105, or the one or more brushes can be connected to any number of brush actuators 105. The brush actuators 105 rotate the brushes 102, such that the brush 102 is pressed or urged against the surface 101A, 101B of the substrate 101. The brushes 102 can rotate in either a clockwise or counterclockwise direction. The brushes 102 can rotate in the same direction, or in different directions from what another. The brushes 102 can be mounted via the channel 104.

The plurality of rollers 110 rotate the substrate 101 during cleaning, increasing the removal of debris and residue from the surfaces 101A, 101B of the substrate. One or more roller actuators 120 are configured to rotate the plurality of rollers 110. The plurality of rollers 110 can rotate the substrate 101 in either a clockwise or counterclockwise direction.

The channel 104 of the brush 102 is fluidly connected to the fluid input 131. The fluid input 131 is fluidly connected to a fluid source 130. The fluid source 130 is configured to deliver a cleaning liquid 115 to the brush 102, and thus to the surface of the substrate 101 through the brushing elements 103 and/or body 109. In other embodiments, the fluid source 130 is configured to deliver the cleaning liquid 115 directly to a surface of the substrate 101 via a nozzle (not shown) not attached to the brush 102. In other embodiments, the brush 102 does not include brushing elements, and the cleaning liquid 115 is delivered by pores holes in the body 109.

For effective cleaning, it is desired that the brushing surface is approximately coplanar to the substrate surface 101A, 101B. In some embodiments, the brush 102 includes a plurality of brushing elements 103. The brushing elements 103 include any element that can used in the art that can make effective contact with the substrate surface 101A, 101B such that the brushing surface is substantially in the same plane as the substrate surface. The brushing elements 103 can include any feature used in the art to clean a surface, such as, but not limited to, nodules, nodes, brushes, or wipers. The brushing elements 103 can be of conventional size, such as about 1 mm dimensions, or microscopic, such as about 1 μm dimensions. As disclosed herein, the dimension of the brushing element 103 can be a radius, diameter, and/or height of the brushing element. Although the brushing elements 103 are arranged in a rectangular grid as shown in FIGS. 1A and 1B, the brushing elements can form any desired pattern. In some embodiments, the brushing elements 103 have a star-shape, which allow the brushing elements to remove more debris present on the substrate 101.

The brushing elements 103 include nodules with dimensions from about 10 μm to about 1 mm, such as from about 50 μm to about 250 μm, according to one embodiment. The brushing elements 103 include wipers with dimensions from about 50 μm to about 500 μm, according to one embodiment. Wiper like features have rectangular shape and are expected to be most effective in the 100-500 um length with 50-100 um width. All features are nominally 50-100 μm high, though could also be as small as 20 and as high as 200 um.

The brushing elements 103 are pressed or urged against the surface 101A, 101B of the substrate 101 during cleaning. In some embodiments, the brushing elements 103 are configured to eject the cleaning liquid 115 onto a surface of the substrate 101. The brushing elements 103 include holes and/or pores configured to deliver the cleaning liquid 115. The combination of the urging of the brushing elements 103 and delivering the cleaning liquid 115 assists in removing debris and other contaminants from the surface of the substrate 101. The cleaning liquid 115 can include any liquid used in the art for cleaning of a substrate, such as a high pH solution.

FIG. 2 illustrates a zoomed-in portion of the brush 102, according to one embodiment. The body 109 include a first polymer material. As shown, the body 109 includes a plurality of body holes (alternatively referred to as body pores) 210 having a first body region 211. The body holes 210 are configured to have different shapes and sizes, such as, but not limited to, circular, polygonal, or irregular shapes. The body holes 210 holes have a dimension from about 10 μm to about 100 μm. The body holes 210 are fluidly connected to the channel 104. The body holes 210 are interconnected with one another, such that the body holes are configured to deliver a cleaning solution therethrough. The cleaning solution flows through the channel 104, and the body holes 210, such that the cleaning solution (e.g., the cleaning liquid 115 of FIGS. 1A and 1B) is delivered to a surface of a substrate (e.g., the surfaces 101A, 101B of the substrate 101 of FIGS. 1A and 1B). As used herein, "porosity" refers to the volume of void-space as a percentage of the total bulk volume in a given sample. The porosity of the first body region 211 is greater than about 70%. The high porosity of the first body region 211 allows for an efficient ejection of cleaning liquid (e.g., the cleaning liquid 115 of FIGS. 1A and 1B) through the large volume of the holes in the first body region.

The plurality of body holes 210 has a second body region 213, and a second body porosity of the second body region is greater than the first body porosity, according to one embodiment. The plurality of body holes 210 has a third body region 212, a third body porosity of the third body region is greater than the first body porosity, and the third body porosity is less than the second body porosity, according to one embodiment. The plurality of body holes 210 can have a size gradient between regions. Said another way, the size of the body holes 210 can vary linearly or in any other fashion in different portions of the body 109. The body hole 210 size can vary along the surface of the body 109 (i.e., the X-Y plane) or through the depth of the body (i.e., the Z direction). In some embodiments, the body holes 210 are larger close to the channel 104 and the body holes become smaller at a surface of the body 102. This allows for a larger volume of cleaning liquid to be passed from the channel 104 to the substrate through the body holes 210, thus improving the cleaning of the substrate.

The brush 102 includes the plurality of brushing elements 103, according to some embodiments. The brushing element 103 includes a second polymer material. The first polymer material of the body 109 is different from the second polymer material of the brushing elements 103, according to one embodiment. The first polymer material of the body 109 is the same as the second polymer material of the brushing elements 103, according to one embodiment.

As shown, the brushing element 103 includes a plurality of element holes (alternatively referred to as element pores) 220 having a first element region 221. The element holes 220 are configured to have different shapes and sizes, such as, but not limited to, circular, polygonal, or irregular shapes. The element holes 220 are fluidly connected to the channel 104. The element holes 220 are interconnected, such that the element holes are configured to deliver a cleaning solution therethrough. The cleaning solution flows through the channel 104, and the element holes 220, such that the cleaning solution (e.g., the cleaning liquid 115 of FIGS. 1A and 1B) is delivered to a surface of a substrate (e.g., the surfaces 101A, 101B of the substrate 101 of FIGS. 1A and 1B). The porosity of the first element region 221 is greater than about 70%. The high porosity of the first element region 221 allows for an efficient ejection of cleaning liquid (e.g., the cleaning liquid 115 of FIGS. 1A and 1B) through the large volume of the holes in the first element region.

The plurality of element holes 220 has a second element region 223, and a second body porosity of the second element region is greater than the element body porosity, according to one embodiment. The plurality of element holes 220 has a third element region 222, a third element porosity of the third element region is greater than the first element porosity, and the third element porosity is less than the second element porosity, according to one embodiment. The first element porosity is greater than the first body porosity, according to one embodiment.

The plurality of element holes 220 can have a size gradient between regions. Said another way, the size of the holes 220 can vary linearly or in any other fashion in different portions of the brushing element 103. The hole 220 size can vary along the surface of the brushing element 103 (i.e., the X-Y plane) or through the depth of the brushing element (i.e., the Z direction). In some embodiments, the element holes 220 are larger close to the channel 104 and the element holes become smaller at a surface of the brushing element 103. This allows for a larger volume of cleaning liquid to be passed from the channel 104 to the substrate through the element holes 220, thus improving the cleaning of the substrate.

Typically, the holes disclosed herein have (X-Y) dimensions which are about 500 µm or less, such as about 400 µm or less, about 300 µm or less, about 200 µm or less, or about 150 µm or less. In some embodiments, the holes will have at least one lateral dimension that is about 5 µm or more, about 10 µm or more, about 25 µm or more, or about 50 µm or more. In some embodiments, the holes will have at least one lateral dimension in the range of about 50 µm to about 250 µm, such as in the range of about 50 µm to about 200 µm, about 50 µm to about 150 µm. The holes are spaced apart by about 5 µm or more, such as about 10 µm or more, 20 µm or more, 30 µm or more, 40 µm or more, or 50 µm or more.

Figure 3A:
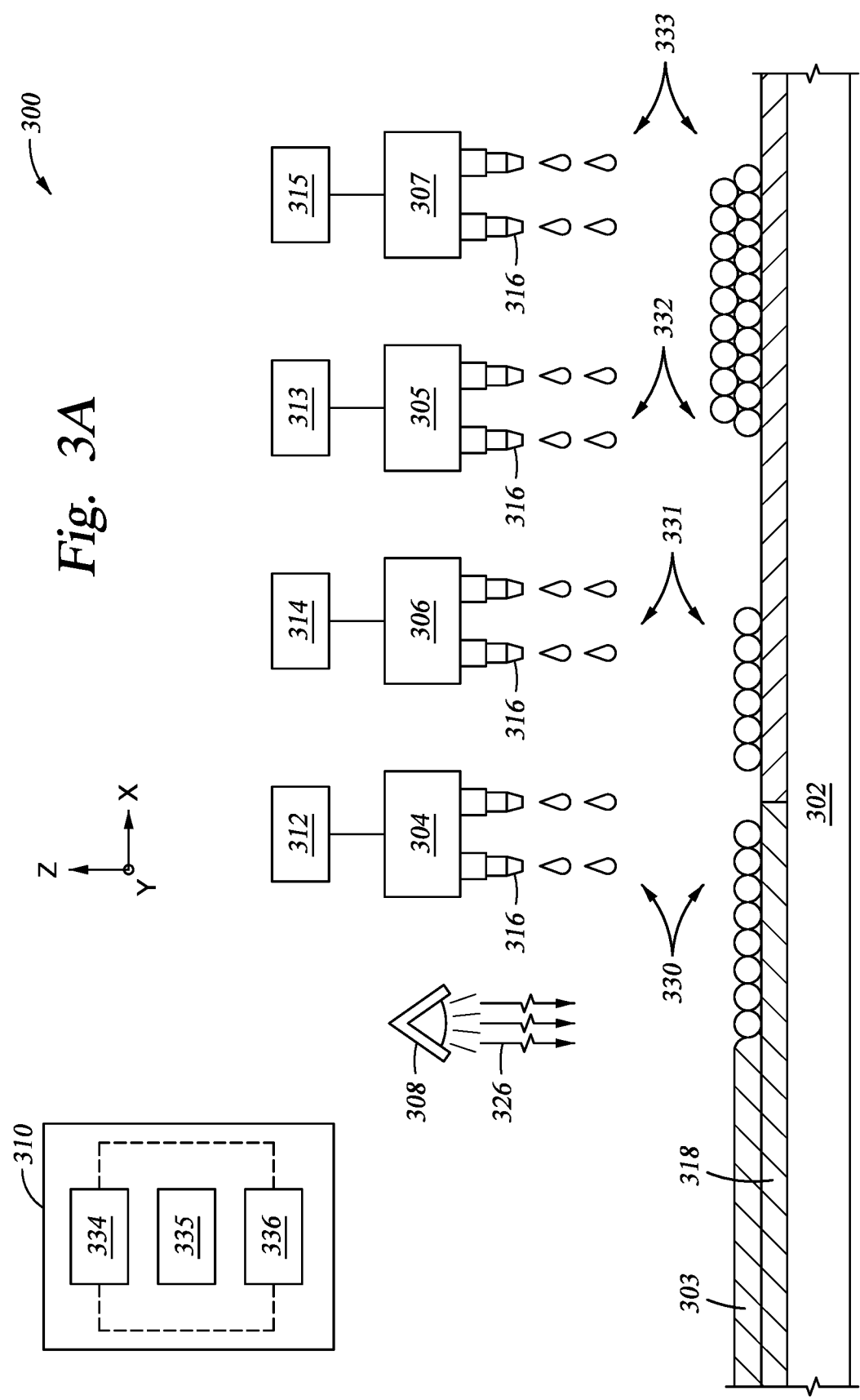
FIG. 3A illustrates a schematic sectional view of an additive manufacturing system, according to one embodiment.

FIG. 3A illustrates a schematic sectional view of an additive manufacturing system 300, according to one embodiment. The additive manufacturing system 300 is configured to print component 303 (e.g., the brush 102) using a three-dimensional (3D) printing process. As shown, the additive manufacturing system 300 includes a movable manufacturing support 302, a plurality of dispense heads 304, 305, 306, 307 disposed above the manufacturing support 302, a treatment source 308, and a system controller 310. The dispense heads 304, 305, 306, 307 can move independently of one another and independently of the manufacturing support 302 during the polishing pad manufacturing process. The first and second dispense heads 304 and 306 are respectively fluidly coupled to a first pre-polymer composition source 312 and a first sacrificial material source 314 which are used to form the body 109 including the first polymer material and the plurality of body holes 210 described in FIG. 2 above. The third and fourth dispense heads 305 and 307 are respectively fluidly coupled to a second pre-polymer composition source 313 and second sacrificial material source 315 which are used to form the brushing elements 103 including the second polymer material and the plurality of element holes 220 described in FIG. 2 above.

In some embodiments, the additive manufacturing system 300 includes as many dispense heads as desired to each dispense a different pre-polymer composition or sacrificial material precursor composition. In some embodiments, the additive manufacturing system 300 further comprises pluralities of dispense heads where two or more dispense heads are configured to dispense the same pre-polymer compositions or sacrificial material precursor compositions.

Here, each of dispense heads 304, 305, 306, 307 features an array of droplet ejecting nozzles 316 configured to eject droplets 330, 331, 332, 333 of the first pre-polymer composition 312, the first sacrificial material composition 314, the second pre-polymer composition 313, and the second sacrificial material composition 315, respectively, delivered to the dispense head reservoirs. Here, the droplets 330, 331, 332, 333 are ejected towards the manufacturing support 302 and thus onto the manufacturing support 302 or onto a previously formed print layer 318 disposed on the manufacturing support 302. Typically, each of the dispense heads 304, 305, 306, 307 is configured to fire (e.g., control the ejection of) droplets 330, 331, 332, 333 from each of the nozzles 316 in a respective geometric array or pattern independently of the firing other nozzles 316 thereof. Herein, the nozzles 316 are independently fired according to a droplet dispense pattern for a print layer to be formed as the dispense heads 304, 305, 306, 307 move relative to the manufacturing support 302. Once dispensed, the droplets of the first and/or second pre-polymer composition and/or the droplets of the first and/or second sacrificial material composition are at least partially treated. The treatment can include exposure to electromagnetic radiation (e.g., ultraviolet (UV) radiation) provided by an electromagnetic radiation source, such as a treatment source 308 including a UV light source, to form a print layer.

Figure 3B:
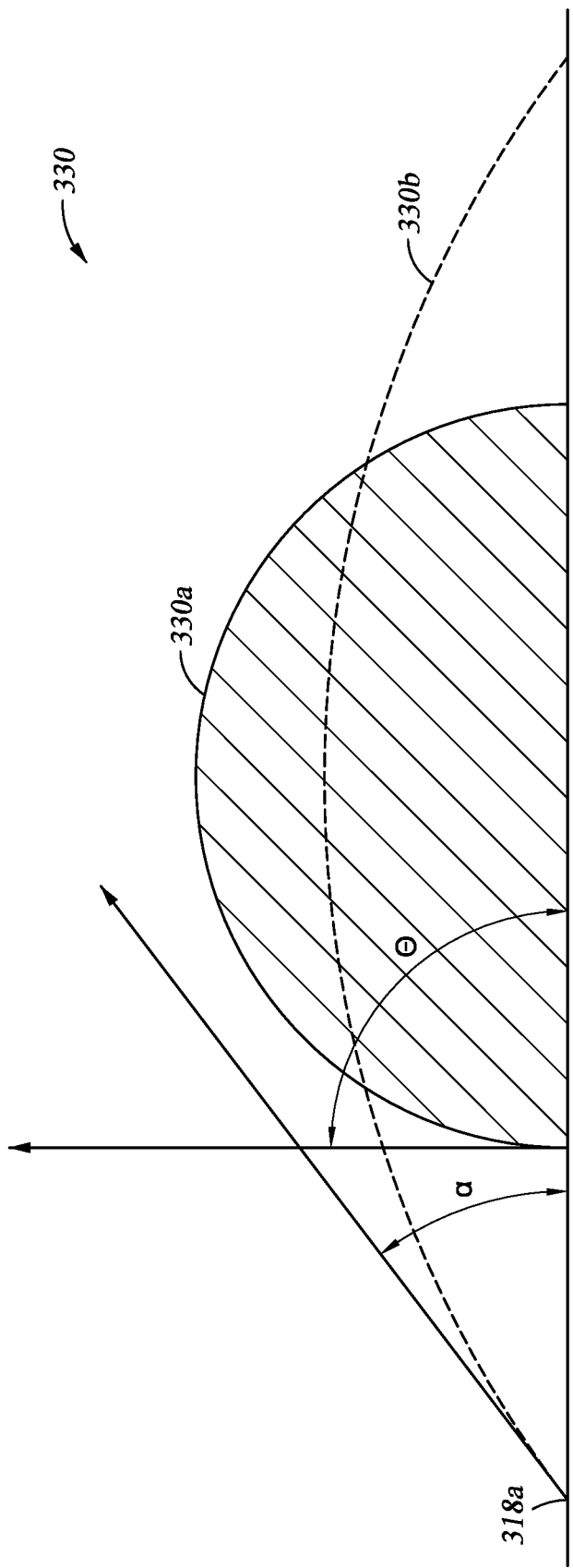
FIG. 3B illustrates a schematic cross-sectional view of a droplet disposed on a surface, according to one embodiment.

In some embodiments, dispensed droplets of the pre-polymer compositions, such as the dispensed droplets 330 of the first pre-polymer composition, are exposed to electromagnetic radiation to physically fix the droplet before it spreads to an equilibrium size as shown in FIG. 3B. Typically, the dispensed droplets are exposed to electromagnetic radiation to at least partially cure the pre-polymer compositions thereof within 1 second or less of the droplet contacting a surface, such as the surface of the manufacturing support 302 or of a previously formed print layer 318 disposed on the manufacturing support 302.

FIG. 3B illustrates a schematic cross-sectional view of a droplet 330a disposed on a surface 318a, according to one embodiment. In a typically additive manufacturing process, a droplet of pre-polymer composition, such as the droplet 330a, will spread and reach an equilibrium contact angle α with the surface 318a of a previously formed layer within about one second from the moment in time that the droplet 330a contacts the surface 318a. The equilibrium contact angle α is a function of at least the material properties of the pre-polymer composition and the energy at the surface 318a (e.g., the surface energy) of the previously formed layer (e.g., previously formed layer 318). In some embodiments, it is desirable to at least partially cure the dispensed droplet before it reaches an equilibrium size, in order to fix the contact angle of the droplet with the surface 318a of the previously formed layer. In those embodiments, the fixed droplet's 330b contact angle θ is greater than the equilibrium contact angle α of the droplet 330a of the same pre-polymer composition which was allowed to spread to its equilibrium size.

Herein, at least partially curing a dispensed droplet causes the at least partial polymerization (e.g., cross-linking) of the pre-polymer composition(s) within the droplets and with adjacently disposed droplets of the same or different pre-polymer composition to form a continuous polymer phase. In some embodiments, the pre-polymer compositions are dispensed and at least partially cured to form a well about a desired pore before a sacrificial material composition is dispensed thereinto.

The pre-polymer compositions used to form the first polymer material of the body 109 and the second polymer material of the brushing elements 103 described above each comprise a mixture of one or more of functional polymers, functional oligomers, functional monomers, reactive diluents, and photoinitiators. The pre-polymer compositions for the first polymer material and the second polymer material are the same or different, according to one embodiment. The first polymer material and the second polymer material are the same or different, according to one embodiment.

Examples of suitable functional polymers which may be used to form one or both of the at least two pre-polymer compositions include multifunctional acrylates including di, tri, tetra, and higher functionality acrylates, such as 1,3,5-triacryloylhexahydro-1,3,5-triazine or trimethylolpropane triacrylate.

Examples of suitable functional oligomers which may be used to form one or both of the at least two pre-polymer compositions include monofunctional and multifunctional oligomers, acrylate oligomers, such as aliphatic urethane acrylate oligomers, aliphatic hexafunctional urethane acrylate oligomers, diacrylate, aliphatic hexafunctional acrylate oligomers, multifunctional urethane acrylate oligomers, aliphatic urethane diacrylate oligomers, aliphatic urethane acrylate oligomers, aliphatic polyester urethane diacrylate blends with aliphatic diacrylate oligomers, or combinations thereof, for example bisphenol-A ethoxylate diacrylate or polybutadiene diacrylate, tetrafunctional acrylated polyester oligomers, and aliphatic polyester based urethane diacrylate oligomers.

Examples of suitable monomers which may be used to from one or both of the at least two pre-polymer compositions include both mono-functional monomers and multi-functional monomers. Suitable mono-functional monomers include tetrahydrofurfuryl acrylate (e.g. SR285 from Sartomer®), tetrahydrofurfuryl methacrylate, vinyl caprolactam, isobornyl acrylate, isobornyl methacrylate, 2-phenoxyethyl acrylate, 2-phenoxyethyl methacrylate, 2-(2-ethoxyethoxy)ethyl acrylate, isooctyl acrylate, isodecyl acrylate, isodecyl methacrylate, lauryl acrylate, lauryl methacrylate, stearyl acrylate, stearyl methacrylate, cyclic trimethylolpropane formal acrylate, 2-[[(Butylamino) carbonyl]oxy]ethyl acrylate (e.g. Genomer 1122 from RAHN USA Corporation), 3,3,5-trimethylcyclohexane acrylate, or mono-functional methoxylated PEG (350) acrylate. Suitable multifunctional monomers include diacrylates or dimethacrylates of diols and polyether diols, such as propoxylated neopentyl glycol diacrylate, 1,6-hexanediol diacrylate, 1,6-hexanediol dimethacrylate, 1,3-butylene glycol diacrylate, 1,3-butylene glycol dimethacrylate 1,4-butanediol diacrylate, 1,4-butanediol dimethacrylate, alkoxylated aliphatic diacrylate (e.g., SR9209A from Sartomer®), diethylene glycol diacrylate, diethylene glycol dimethacrylate, dipropylene glycol diacrylate, tripropylene glycol diacrylate, triethylene glycol dimethacrylate, alkoxylated hexanediol diacrylates, or combinations thereof, for example SR562, SR563, SR564 from Sartomer®.

Typically, the reactive diluents used to form one or more of the pre-polymer compositions are least monofunctional, and undergo polymerization when exposed to free radicals, Lewis acids, and/or electromagnetic radiation. Examples of suitable reactive diluents include monoacrylate, 2-ethylhexyl acrylate, octyldecyl acrylate, cyclic trimethylolpropane formal acrylate, caprolactone acrylate, isobornyl acrylate (IBOA), or alkoxylated lauryl methacrylate.

Examples of suitable photoinitiators used to form one or more of the at least two different pre-polymer compositions include polymeric photoinitiators and/or oligomer photoinitiators, such as benzoin ethers, benzyl ketals, acetyl phenones, alkyl phenones, phosphine oxides, benzophenone compounds and thioxanthone compounds that include an amine synergist, or combinations thereof.

Examples of first and/or second polymer materials formed by the pre-polymer compositions described above typically include at least one of oligomeric and, or, polymeric segments, compounds, or materials selected from the group consisting of: polyamides, polycarbonates, polyesters, polyether ketones, polyethers, polyoxymethylenes, polyether sulfone, polyetherimides, polyimides, polyolefins, polysiloxanes, polysulfones, polyphenylenes, polyphenylene sulfides, polyurethanes, polystyrene, polyacrylonitriles, polyacrylates, polymethylmethacrylates, polyurethane acrylates, polyester acrylates, polyether acrylates, epoxy acrylates, polycarbonates, polyesters, melamines, polysulfones, polyvinyl materials, acrylonitrile butadiene styrene (ABS), halogenated polymers, block copolymers, and random copolymers thereof, and combinations thereof.

In one embodiment, first and second polymer materials include molecules with a soft core and acrylate functional groups. UV curing these functional groups results in polymerization of the molecules, thus forming the first and/or second polymer materials. For example, a UV curable formation of molecules, when exposed to UV light, forms a soft hydrophilic matrix to match wet PVA. Examples of the soft core include, but are not limited to, silicone, PVA, urethane, aliphatic urethane, acetate, epoxide, and combinations thereof.

The sacrificial material composition(s) used to form the plurality of body holes 210 and/or the plurality of element holes 220 described above, include water-soluble material, such as, glycols (e.g., polyethylene glycols), glycol-ethers, and amines. Examples of suitable sacrificial material precursors which may be used to form the pore forming features described herein include ethylene glycol, butanediol, dimer diol, propylene glycol-(1,2) and propylene glycol-(1,3), octane-1,8-diol, neopentyl glycol, cyclohexane dimethanol (1,4-bis-hydroxymethylcyclohexane), 2-methyl-1,3-propane diol, glycerine, trimethylolpropane, hexanediol-(1,6), hexanetriol-(1,2,6) butane triol-(1,2,4), trimethylolethane, pentaerythritol, quinitol, mannitol and sorbitol, methylglycoside, also diethylene glycol, triethylene glycol, tetraethylene glycol, polyethylene glycols, dibutylene glycol, polybutylene glycols, ethylene glycol, ethylene glycol monobutyl ether (EGMBE), diethylene glycol monoethyl ether, ethanolamine, diethanolamine (DEA), triethanolamine (TEA), and combinations thereof.

In some embodiments, the sacrificial material precursor comprises a water soluble polymer, such as 1-vinyl-2-pyrrolidone, vinylimidazole, polyethylene glycol diacrylate, acrylic acid, sodium styrenesulfonate, Hitenol BC10®, Maxemul 6106®, hydroxyethyl acrylate and [2-(methacryloyloxy)ethyltrimethylammonium chloride, 3-allyloxy-2-hydroxy-1-propanesulfonic acid sodium, sodium 4-vinylbenzenesulfonate, [2-(methacryloyloxy)ethyl]dimethyl-(3-sulfopropyl)ammonium hydroxide, 2-acrylamido-2-methyl-1-propanesulfonic acid, vinylphosphonic acid, allyltriphenylphosphonium chloride, (vinylbenzyl)trimethylammonium chloride, allyltriphenylphosphonium chloride, (vinylbenzyl)trimethylammonium chloride, E-SPERSE RS-1618, E-SPERSE RS-1596, methoxy polyethylene glycol monoacrylate, methoxy polyethylene glycol diacrylate, methoxy polyethylene glycol triacrylate, or combinations thereof.

The system controller 310 is configured to control the various components of the additive manufacturing system 300. As shown, the system controller 310 includes a programmable central processing unit (CPU) 334 which is operable with a memory 335 (e.g., non-volatile memory) and support circuits 336. The support circuits 336 are conventionally coupled to the CPU 434 and comprise cache, clock circuits, input/output subsystems, power supplies, and the like, and combinations thereof coupled to the various components of the additive manufacturing system 300, to facilitate control thereof. The CPU 334 is one of any form of general purpose computer processor used in an industrial setting, such as a programmable logic controller (PLC), for controlling various components and sub-processors of the additive manufacturing system 300. The memory 335, coupled to the CPU 334, is non-transitory and is typically one or more of readily available memories such as random access memory (RAM), read only memory (ROM), floppy disk drive, hard disk, or any other form of digital storage, local or remote.

Typically, the memory 335 is in the form of a computer-readable storage media containing instructions (e.g., non-volatile memory), which when executed by the CPU 334, facilitates the operation of the manufacturing system 300. The instructions in the memory 335 are in the form of a program product such as a program that implements the methods of the present disclosure.

The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as compact disc-read only memory (CD-ROM) disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the polishing pad manufacturing methods set forth herein are performed by a combination of software routines, ASIC(s), FPGAs and, or, other types of hardware implementations.

The system controller 310 directs the motion of the manufacturing support 302, the motion of the dispense heads 304, 305, 306, 307, the firing of the nozzles 316 to eject droplets of pre-polymer compositions therefrom, and the degree and timing of the treatment of the dispensed droplets provided by the treatment source 308. In some embodiments, the instructions used by the system controller to direct the operation of the manufacturing system 300 include droplet dispense patterns for each of the print layers to be formed. In some embodiments, the droplet dispense patterns are collectively stored in the memory 325 as CAD-compatible digital printing instructions. Examples of print instructions which can be used by the additive manufacturing system 300 to manufacture the brushes described herein are shown in FIG. 4.

In one embodiment, three-dimensional (3D) printing (or 3D printing) is used to produce (or make) brushes (e.g., brushes 102 of FIGS. 1A and 1B) described herein. In one embodiment, a computer (e.g., CAD) model of the required part is first made and then a slicing algorithm maps the information for every layer. A layer starts off with a thin distribution of powder spread over the surface of a powder bed. A chosen binder material then selectively joins particles where the object is to be formed. Then, a piston which supports the powder bed and the part-in-progress is lowered in order for the next powder layer to be formed. After each layer, the same process is repeated, followed by a final heat treatment to make the object. Since 3D printing can exercise local control over the material composition, microstructure, and surface texture, various (and previously inaccessible) geometries may be achieved with this method.

In one embodiment, a brush (e.g., brushes 102 of FIGS. 1A and 1B) as described herein is represented in a data structure readable by a computer rendering device or a computer display device. The computer-readable medium can contain a data structure that represents the brush. The data structure can be a computer file, and can contain information about the structures, materials, textures, physical properties, or other characteristics of one or more articles. The data structure can also contain code, such as computer executable code or device control code, that engages selected functionality of a computer rendering device or a computer display device. The structure includes at least one of test data files, characterization data, verification data, or design specifications, according to one embodiment. The structure resides on a storage medium as a data format used for the exchange of layout data, according to one embodiment. The data structure can be stored on the computer-readable medium. The computer readable medium can include a physical storage medium such as a magnetic memory, floppy disk, or any convenient physical storage medium. The physical storage medium can be readable by the computer system to render the article represented by the data structure on a computer screen or a physical rendering device which may be an additive manufacturing device (e.g. the additive manufacturing devices 300, 600), such as a 3D printer.

Figure 4:
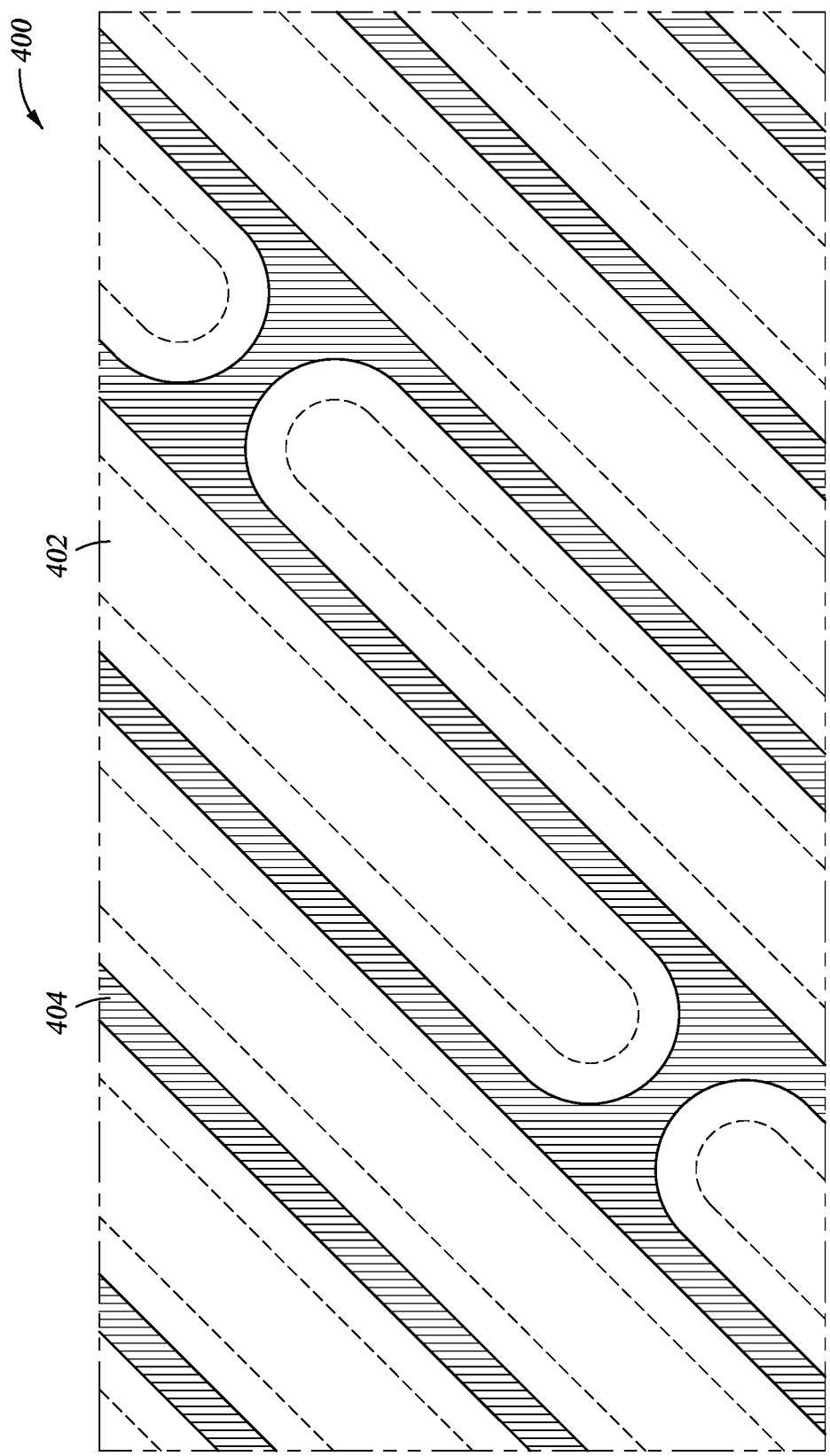
FIG. 4 illustrates a portion of computer-aided design (CAD) compatible print instructions, according to one embodiment.

FIG. 4 illustrates a portion of CAD compatible print instructions 400, according to one embodiment. The CAD compatible print instructions 400 can be used by the additive manufacturing systems 300 and 600 (described in further detail below) to form embodiments of the brushes 102 described herein. Here, the print instructions 400 are for print layers used to form a plurality of hole regions 402 (represented by white regions). Although the hole regions 402 are depicted as regular rows of holes, it is to be understood that any sort of set of holes, along with any hole shape, can be included herein. The plurality of hole regions 402 can include either, or both, of the plurality of body holes 210 and/or the plurality of element holes 220. Each of the material regions 404 (represented by black regions) are formed of a polymer material (e.g. the first and/or second polymer material, and/or the solid material 630 (FIGS. 6A and 6B)). When the additive manufacturing system 300 is used, droplets of the pre-polymer composition(s) used to form the first and/or second polymer materials are dispensed in the material regions 404 and droplets of the sacrificial material composition(s) are dispensed within the hole regions 402. Thus, holes are eventually created in the hole regions 402, whereas the material regions 404 remain as the first or second polymer material. The print instructions 400 can be used to form body regions (e.g., the first, second, and third body regions 211, 212, 213) and/or element regions (e.g., the first, second, and third element regions 221, 222, 223).

Figure 5:
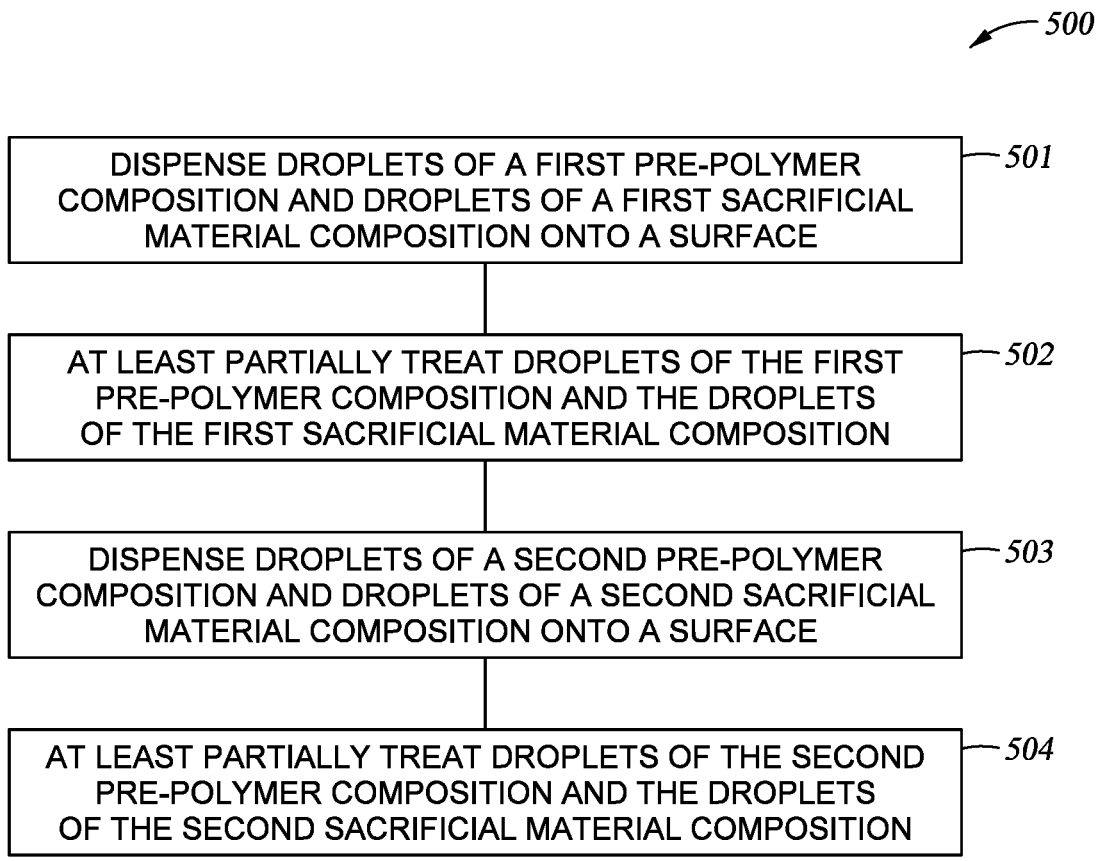
FIG. 5 is a flow diagram for method operations of forming a brush, according to one embodiment.

FIG. 5 is a flow diagram for method 500 operations of forming a brush, according to one embodiment. Although the method 500 operations are described in conjunction with FIGS. 3A and 5, persons skilled in the art will understand that any system configured to perform the method operations, in any order, falls within the scope of the embodiments described herein. Embodiments of the method 500 may be used in combination with one or more of the systems and system operations described herein, such as the additive manufacturing system 300 of FIG. 3A and the CAD compatible print instructions 400 of FIG. 4. The method 500 can be stored or accessible to the controller 310 as computer readable media containing instructions, that when executed by a processor of the controller 310, cause the additive manufacturing system 300 to perform the method 500. Further, embodiments of the method 500 can be used to form any one or combination of embodiments of the brushes (e.g., brush 102) shown and described herein.

The method 500 includes a 3D printing process of forming the brush. The 3D printing process can include stereolithography (SLA), powder bed printing, multi-jet printing, fused deposition modeling (FDM), digital light processing (DLP) printing, continuous liquid interface production (CLIP), and any combination of the above. SLA, DLP, and CLIP methods do not require active porogens to create porosity, reducing the need for lengthy post-cleaning of the brushes. 3D printing allows for tunable control of the brushing surfaces of the brushes. 3D printing allows tunable properties (e.g., hole size, hole density, hole variation) across the length and depth of the brush. 3D printing allows for formation of the body and the brushing elements in a single step.

Method 500 includes forming a body of a component (e.g., brush 102) using a (3D) printing process, the body comprising a first polymer material comprising a plurality of body holes, the plurality of body holes having a first body region, wherein the a first body porosity of the first body region is greater than about 70%, and forming a channel in the body of the brush using a 3D printing process, the channel fluidly coupled to the body plurality of holes. In some embodiments, the method 500 begins at operation 501, where droplets of a first pre-polymer composition and droplets of a first sacrificial material composition are dispensed onto a surface. The surface can be, for example, a previously formed print layer according to a predetermined droplet dispense pattern.

At operation 502, the dispensed droplets of the first pre-polymer composition are at least partially treated to form at least portions of a body of a brush (e.g., the body 109 of the brush 102) having a plurality of holes (e.g., the plurality of body holes 210), the body including the first polymer material. The plurality of body holes has a first body region, wherein the first body porosity of the first body region is greater than about 70%. The plurality of body holes has a second body region, and a second body porosity of the second body region is greater than the first body porosity, according to one embodiment. The first polymer material has a third body region, a third body porosity of the third body region is greater than the first body porosity, and the third body porosity is less than the second body porosity, according to one embodiment. The high porosity of the body holes can be achieved by improved control of material properties of the body through 3D printing. Operations 501 and 502 are performed simultaneously, according to one embodiment.

At operation 503, droplets of a second pre-polymer composition and droplets of a second sacrificial material composition are dispensed onto a surface. The surface can be, for example, a previously formed print layer according to a predetermined droplet dispense pattern. The surface can also be the finished or partially finished body of the brush.

At operation 504, the dispensed droplets of the second pre-polymer composition are at least partially treated to form at least portions of a plurality of brushing elements (e.g., the brushing elements 103) having a plurality of holes (e.g., the plurality of element holes 220), the brushing elements including the second polymer material. The plurality of element holes has a first element region, wherein the first element porosity of the first element region is greater than about 70%. The high porosity of the element holes can be achieved by improved control of material properties of the body through 3D printing.

The plurality of element holes has a second element region, and a second element porosity of the second element region is greater than the first element porosity, according to one embodiment. The first polymer material has a third element region, a third element porosity of the third element region is greater than the first element porosity, and the third element porosity is less than the second element porosity, according to one embodiment. The first element porosity is greater than the first body porosity, according to one embodiment.

Operation 504 includes exposing the dispensed droplets to UV light, according to one embodiment. Operations 503 and 504 are performed simultaneously, according to one embodiment. Operations 501 and 503 are performed simultaneously, according to one embodiment. Operations 502 and 504 are performed simultaneously, according to one embodiment.

In some embodiments, the method 500 further includes sequential repetitions of operations 501 and 502 and/or operations 503 and 504 to form a plurality of print layers stacked in a Z-direction, i.e., a direction orthogonal to the surface of the manufacturing support or a previously formed print layer disposed thereon. The predetermined droplet dispense pattern used to form each print layer may be the same or different as a predetermined droplet dispense pattern used to form a previous print layer disposed there below.

Figure 6A:
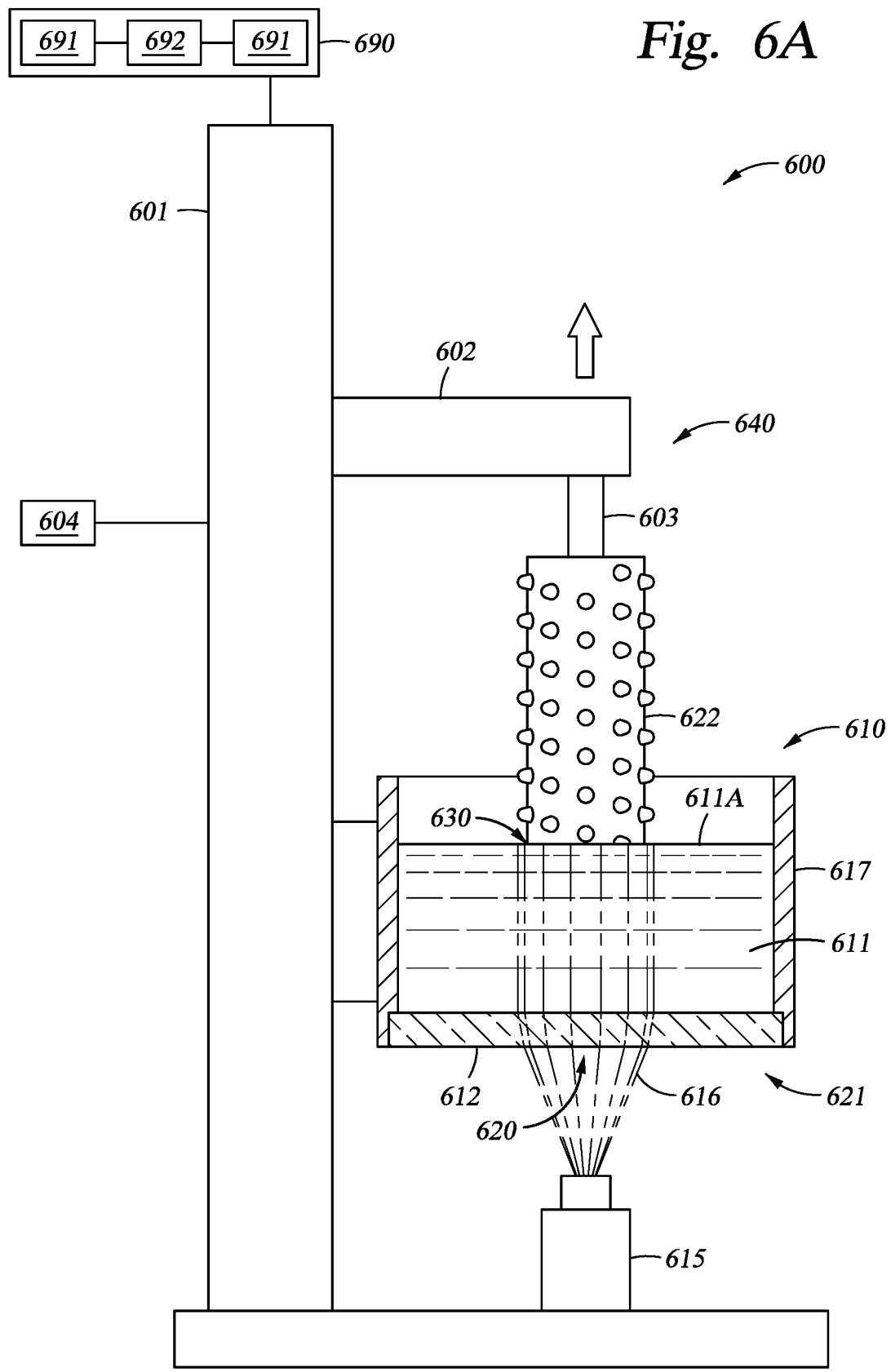
FIGS. 6A and 6B illustrate schematic sectional views of an additive manufacturing system, according to one embodiment.

FIG. 6A illustrates a schematic sectional view of an additive manufacturing system 600, according to one embodiment. The additive manufacturing system 600 is configured to print component 622 (e.g., the brush 102) using a three-dimensional (3D) printing process, such as a CLIP process. As shown, the additive manufacturing system 600 includes a motion system 640, a tank system 610, a treatment source 615, and a controller 690. The motion system 640 is disposed above the tank system 610. The tank system 610 is disposed above the treatment source 615. In some embodiments, the treatment source 615 is disposed above, or to the side of, the tank system 610.

The tank system 610 is configured to hold a printing liquid 611 therein. The printing liquid 611 can include any of the chemicals identified as pre-polymer condition herein. The printing liquid can also include a photopolymer resin. As shown, the tank system 610 includes a tank 617 having a tank bottom 621 and a membrane 612. The tank bottom 621 includes a portion 620 (e.g., a window) that is permeable to treatment emission 616 produced by the treatment source 615. The membrane 612 is configured such that treatment emission 616 can penetrate the portion 620 of the tank bottom 621. The membrane 612 also prevents the printing liquid from making unwanted contact and/or chemically reacting with the bottom of the tank 617. The membrane 612 creates a "dead zone" or persistent liquid interface, preventing the resin from attaching to the portion 620. For example, if the printing liquid 611 includes a photopolymer, the membrane 612 prevents or reduces photopolymerization between the printing liquid and the portion 620.

The treatment source 615 is configured to emit treatment emission 616 onto the surface 611A of the printing liquid 611 disposed in the tank system 610. The treatment source 615 emits the treatment emission 616 in a certain pattern over time, and the patterns over time create the component 622. The treatment emission 616 treats the printing liquid 611 at the surface 611A such that the printing liquid becomes a solid material 630. The solid material 630 forms a portion of the component 622. The solid material 630 can be any of the first or second polymer materials described above. Although only one treatment source 615 is shown in FIG. 6A, any number of treatment sources can be included. In some embodiments, a heater (not shown) controls the temperature of the printing liquid 611, which results in finer control of the component 622 structure.

In one example, the printing liquid 611 includes a UV-curable material, the treatment source 615 is configured to emit the treatment emission 616 including UV light, and thus the printing liquid at the surface 611A becomes the solid material 630. In another example, the printing liquid 611 includes a thermally-curable material, the treatment source 615 is configured to emit the treatment emission 616 including thermal energy, and thus the printing liquid at the surface 611A becomes the solid material 630. Other wavelengths of light instead of/in addition to UV light are contemplated, such as visible light, infrared light, x-rays, and the like. UV light and thermal energy are used in combination, in some embodiments. The treatment source 615 further includes a lens system including one or more lenses, and the focal length of the lens system is such that the treatment emission 616 is focused on the surface 611A, according to one embodiment.

The printing liquid 611 includes a UV-curable material, the treatment source 615 is configured to emit the treatment emission 616 including UV light, the portion 620 includes a window permeable to UV light, and the membrane 612 is configured to allow the passage of UV light, according to one embodiment. The membrane 612 is oxygen-permeable, according to some embodiments.

The motion system 640 is configured to move the component 622 during application of the treatment emission 616. As shown, the motion system 640 includes a base 601, a support member 602, a support actuator 604, and a grasper 603. The support member 602 is coupled to the base 601. The grasper 603 is coupled to the solid material 630 of the component 622. The grasper 603 includes any apparatus used in the art that can couple to the solid material 630, such as a build plate or build platform. The support actuator 604 is configured to raise the support member 602, which in turn raises the grasper, during manufacture of the component 622. The pull-rate, or speed, of the support member 602 is about equal to the emission rate of the treatment source 615 and/or the curing rate of the printing liquid 611, according to one embodiment.

The controller 690 is configured to control the various components of the additive manufacturing system 600. As shown, the system controller 690 includes a programmable central processing unit (CPU) 691 which is operable with a memory 692 (e.g., non-volatile memory) and support circuits 693. The support circuits 693 are conventionally coupled to the CPU 691 and include cache, clock circuits, input/output subsystems, power supplies, and the like, and combinations thereof coupled to the various components of the additive manufacturing system 600, to facilitate control thereof. The CPU 691 is one of any form of general purpose computer processor used in an industrial setting, such as a programmable logic controller (PLC), for controlling various components and sub-processors of the additive manufacturing system 600. The memory 692, coupled to the CPU 691, is non-transitory and is typically one or more of readily available memories such as random access memory (RAM), read only memory (ROM), floppy disk drive, hard disk, or any other form of digital storage, local or remote.

Typically, the memory 692 is in the form of a computer-readable storage media containing instructions (e.g., non-volatile memory), which when executed by the CPU 691, facilitates the operation of the manufacturing system 600. The instructions in the memory 692 are in the form of a program product such as a program that implements the methods of the present disclosure.

The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as compact disc-read only memory (CD-ROM) disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the polishing pad manufacturing methods set forth herein are performed by a combination of software routines, ASIC(s), FPGAs and, or, other types of hardware implementations.

The controller 690 directs the speed and power of the support actuator 604, and the intensity and patterns created by the treatment source 615. In some embodiments, the pattern are collectively stored in the memory 692 as CAD-compatible digital printing instructions.

Figure 6B:
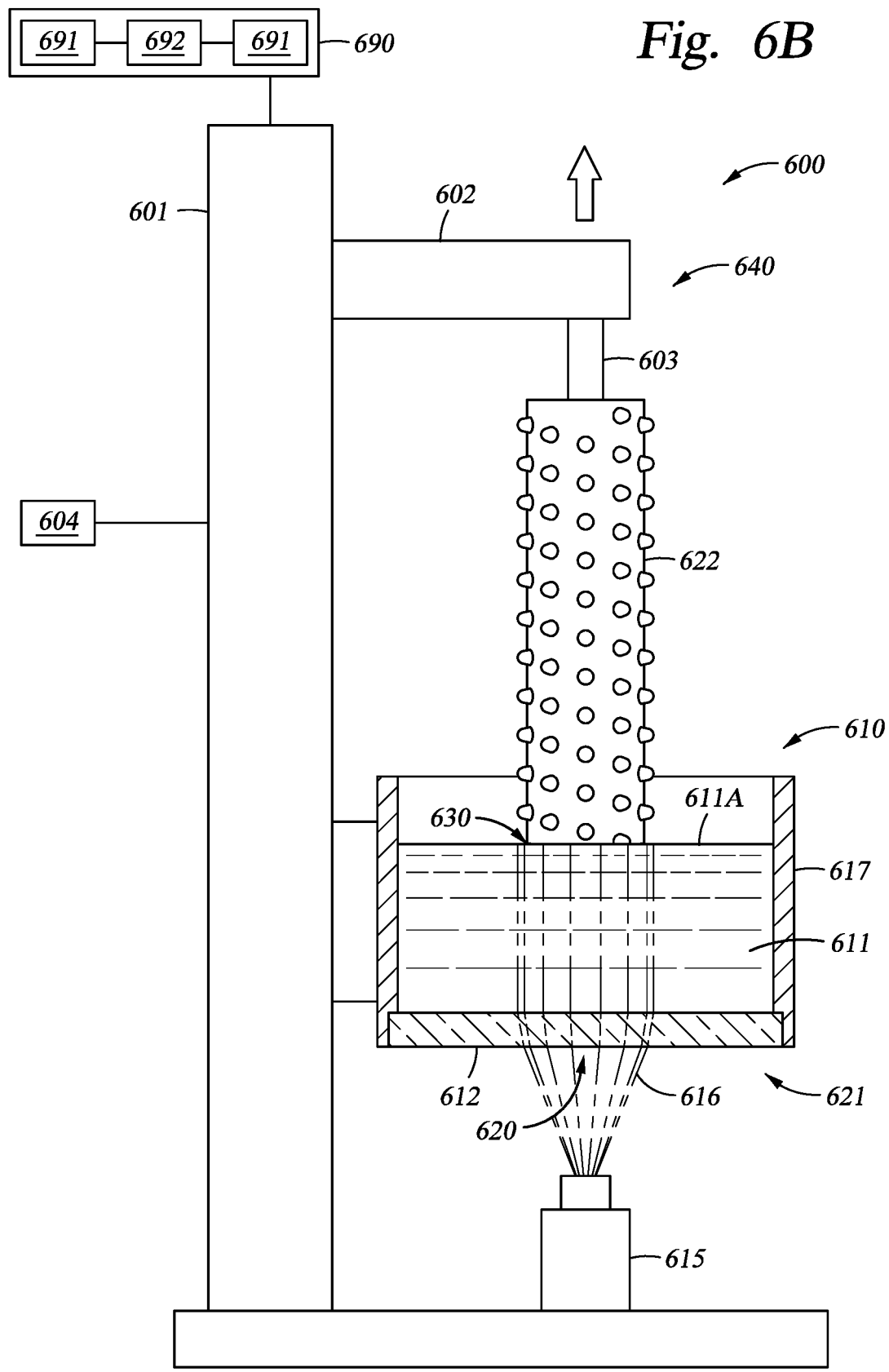

While the support member 602 is raised, the surface 611A of the printing liquid 611 flows to, and is in contact with, the solid material 630. The new portion of the printing liquid 611 is exposed to the treatment emission 616, converting the printing liquid to new solid material 630. FIG. 6B illustrates a schematic sectional view of the additive manufacturing system 600 with the support member 602 in an elevated position, according to one embodiment. As shown in FIG. 6B, more of the component 622 is created as the support member 602 is raised. The treatment emission 616 produced by the treatment source 615 varies with time, and thus the varying pattern of the treatment emission creates the features of the component 622 (e.g., the brush 102). The support member 602 is configured to be raised continuously, and thus the creation of the component 622 is continuous.

When the additive manufacturing system 600 is used, the treatment emission 616 is focused on the printing liquid 611 in the material regions 404, and no treatment emission is focused on the printing liquid in the hole regions 402 (FIG. 4). Thus, holes are eventually created in the hole regions 402, whereas the material regions 404 remain as the solid material 630.

Figure 7:
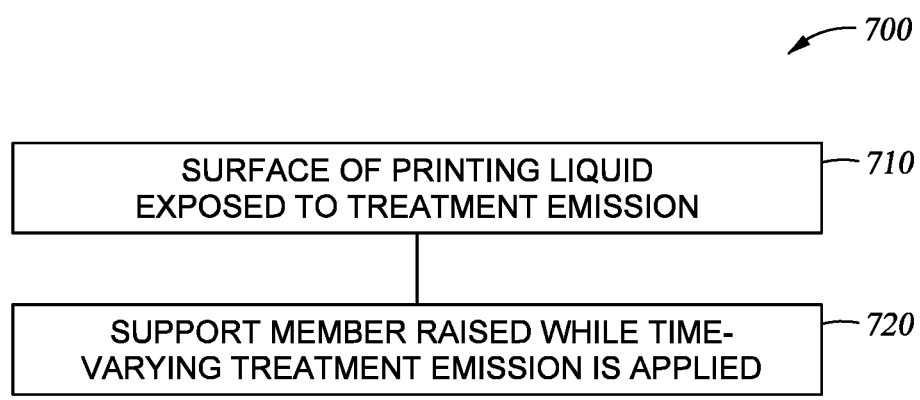
FIG. 7 is a flow diagram for method operations of forming a brush, according to one embodiment.

FIG. 7 is a flow diagram for method 700 operations of forming a brush, according to one embodiment. Although the method 700 operations are described in conjunction with FIGS. 6A, 6B, and 7, persons skilled in the art will understand that any system configured to perform the method operations, in any order, falls within the scope of the embodiments described herein. Embodiments of the method 700 may be used in combination with one or more of the systems and system operations described herein, such as the additive manufacturing system 600 of FIGS. 6A and 6B and the CAD compatible print instructions 400 of FIG. 4. The method 700 can be stored or accessible to the controller 690 as computer readable media containing instructions, that when executed by a processor of the controller 690, cause the additive manufacturing system 600 to perform the method 700. Further, embodiments of the method 700 can be used to form any one or combination of embodiments of the brushes (e.g., brush 102) shown and described herein.

The method 700 includes a 3D printing process of forming a component (e.g., the brush 102). The 3D printing process can include stereolithography (SLA), powder bed printing, multi-jet printing, fused deposition modeling (FDM), digital light processing (DLP) printing, continuous liquid interface production (CLIP), and any combination of the above.

Method 700 includes forming a body of a component (e.g., brush 102) using a (3D) printing process, the body comprising a first polymer material comprising a plurality of body holes, the plurality of body holes having a first body region, wherein the a first body porosity of the first body region is greater than about 70%, and forming a channel in the body of the brush using a 3D printing process, the channel fluidly coupled to the body plurality of holes. In some embodiments, the method 700 begins at operation 710, where a surface of printing liquid is exposed to treatment emission. The surface of the processing liquid is converted into solid material, which makes up a portion of the component. The additive manufacturing system 600 is used, and the surface 611A of the printing liquid 611 is exposed to the treatment emission 616 and converted into the solid material 630, according to one embodiment. The treatment emission 616 includes UV light, according to one embodiment.

At operation 720, a support member attached to the solid material is raised while time-varying treatment emission is applied to the printing liquid. The treatment emission 616 is created by the treatment source 615, according to one embodiment. The treatment emission varies with time, and thus the varying pattern of the treatment emission creates the features of the component (e.g., the brush 102). The support member is raised continuously, and thus the creation of the component is continuous.

The method 700 can be used to create a brush 102 with regions of high porosity. The pore distribution of the brush 102 can be random while still having a porosity above a certain value (e.g., above about 70% porosity). Said another way, although the value of the porosity can be controlled, the hole/pore size and/or distribution can be random. For example, ripples in the printing liquid can induce randomness in the distribution and/or pore size. In another example, inherent jerking or jostling in the raising of the support member induces randomness in the porosity distribution. In yet another example, variations in the wavelength and/or temperature of the treatment emission induces randomness in the porosity distribution. In addition, the method 700 does not require a support structure to support initial growth layers on forming the brush 102.

As described above, a brush, a method of forming a brush, and a structure embodied in a machine readable medium used in a design process are provided. The brush includes a body and a channel configured to deliver a cleaning liquid through holes in the body. The method forms the brush using 3D printing. The structure provides details for making the brush.

The disclosure herein allows a method of forming a brush that does not require the removal of active porogen. This improves the speed and ease of manufacture of the brush. In addition, new designs can be used with the same manufacturing process by varying the details of the structure and 3D printing method.

While the foregoing is directed to embodiments of the present disclosure, other and further embodiments of the disclosure may be devised without departing from the basic scope thereof, and the scope thereof is determined by the claims that follow.

The invention claimed is:

1. A brush, comprising:
a body comprising a first polymer material comprising a first body region and a second body region adjacent to the first body region along a longitudinal length of the body, wherein a first body porosity of the first body region is 70% or greater, wherein a second body porosity of the second body region is greater than the first body porosity, wherein the first body region and the second body region alternate along the longitudinal length of the body; and
a channel disposed in the body, the channel fluidly coupled to a plurality of body holes disposed in the body.

2. The brush of claim 1, wherein
the first polymer material has a third body region disposed between the first body region and the second body region along the longitudinal length of the body, the third body region having a third body porosity greater than the first body porosity and
less than the second body porosity.

3. The brush of claim 1, further comprising a plurality of brushing elements disposed on the body, the brushing elements comprising a second polymer material.

4. The brush of claim 3, wherein
the brushing elements comprise a plurality of element holes having a first element region, wherein a first element porosity of the first element region is greater than 70%, and
the channel is fluidly coupled to the plurality of element holes.

5. The brush of claim 1, wherein the body is a cylindrical body having an outer circumferential surface and an inner circumferential surface, the inner circumferential surface forming the channel.

6. A brush, comprising:
a body comprising a first polymer material comprising a plurality of body holes;
a plurality of brushing elements extending outward from the body, each of the plurality of brushing elements having a plurality of element holes having a porosity that varies radially outward from an element centerline of each of the plurality of brushing elements; and
a channel disposed in the body, the channel fluidly coupled to the plurality of body holes.

7. The brush of claim 6, wherein each element of the plurality of brushing elements comprises a dome shape.

8. The brush of claim 6, wherein the plurality of elements are monolithic with the body.

9. The brush of claim 6, wherein each element of the plurality of elements has a height extending from the body of 20 μm to 200 μm.

10. A brush, comprising:
a body having an outer surface and an inner surface, the body comprising a first polymer material comprising a plurality of body holes, the plurality of body holes having a porosity that varies along a longitudinal length of the body; and
a channel defined by the inner surface of the body, the channel fluidly coupled to the plurality of body holes.

11. The brush of claim 10, wherein the porosity varies along a radial direction of the plurality of holes.

12. A brush, comprising:
a body comprising a first polymer material comprising a first body region, a second body region adjacent to the first body region along a longitudinal length of the body, and a third body region disposed between the first body region and the second body region along the longitudinal length of the body, the third body region having a third body porosity greater than the first body porosity and less than the second body porosity, wherein a first body porosity of the first body region is 70% or greater, wherein a second body porosity of the second body region is greater than the first body porosity; and
a channel disposed in the body, the channel fluidly coupled to a plurality of body holes in the body.

\* \* \* \* \*